United States Patent [19]
Knepper

[11] 4,071,783
[45] Jan. 31, 1978

[54] ENHANCEMENT/DEPLETION MODE FIELD EFFECT TRANSISTOR DRIVER

[75] Inventor: Ronald William Knepper, La Grangeville, N.Y.

[73] Assignee: International Business Machines Corporation, Armonk, N.Y.

[21] Appl. No.: 745,735

[22] Filed: Nov. 29, 1976

[51] Int. Cl.² ............... H03K 17/04; H03K 17/60; H03K 17/12; H03K 3/353

[52] U.S. Cl. ............... 307/270; 307/205; 307/246; 307/251; 307/DIG. 4

[58] Field of Search ............ 307/203, 205, 246, 251, 307/270, 350, 363, 362, DIG. 1, DIG. 4

[56] References Cited

U.S. PATENT DOCUMENTS

| | | | |
|---|---|---|---|
| 3,855,581 | 12/1974 | Greene | 307/DIG. 4 X |
| 3,912,948 | 10/1975 | Bapat | 307/DIG. 4 X |
| 3,988,617 | 10/1976 | Price | 307/DIG. 4 X |

OTHER PUBLICATIONS

Harroun, "Bootstrap Inverter Driver", *IBM Tech. Discl. Bull.;* vol. 19, No. 3, pp. 827–828; 8/1976.

Daniels, et al., "Field-Effect Transistor Push-Pull Driver", *IBM Tech. Discl. Bull.;* vol. 17, No. 10, pp. 2961–2962; 3/1975.

Chu, et al., "Bootstrap Push-Pull Driver", *IBM Tech. Discl. Bull.;* vol. 18, No. 3, pp. 710–711; 8/1975.

Sonoda, "MOSFET Powering circuit", *IBM Tech. Discl. Bull;* vol. 13, No. 9, pp. 2658; 2/1971.

*Primary Examiner*—Larry N. Anagnos
*Attorney, Agent, or Firm*—Theodore E. Galanthay

[57] ABSTRACT

Disclosed is a field effect transistor (FET) driver circuit capable of full supply voltage signal swings and high switching speeds while dissipating relatively little power. The output is obtained from a node between two series connected enhancement mode devices. The first of these series connected enhancement mode devices receives an input signal at its gating electrode, while the second of this pair of series connected devices has its gating electrode capacitively coupled to the output node through a first gatable depletion mode device. The first depletion mode device is in a series electrical path with a second depletion mode device and an enhancement mode device. The second depletion mode device and the enhancement mode device in series therewith receive the same phase of the input signal as the gate of said one series connected output transistor while the first gated depletion mode device is either self-biased or gets a gating input that is out of phase therewith. A depletion mode device in parallel with one of the series connected enhancement mode output devices maintains the output node at a full supply voltage level.

13 Claims, 3 Drawing Figures

ENHANCEMENT/DEPLETION MODE FIELD EFFECT TRANSISTOR DRIVER

CROSS-REFERENCES TO RELATED PUBLICATIONS

R. W. Knepper, "Enhancement/Depletion Mode Field Effect Transistor Driver" IBM Technical Disclosure Bulletin, Volume 19 No. 3, August 1976, page 922-3.

BACKGROUND OF THE INVENTION

1. Field of the Invention

This invention relates to field effect transistor driver circuits and more particularly, to an enhancement/depletion mode FET circuit in which high speed full output voltage swing signals are provided with minimal power dissipation.

2. Description of the Prior Art

An example of an enhancement/depletion mode field effect transistor driver circuit is found in the cross-referenced publication by the inventor of the present invention. As shown in the publication, a pair of enhancement mode field effect transistors are connected in series across a supply potential with an output taken from an output node therebetween. The signals applied to the gates of the two series connected output transistors are out of phase to minimize the flow of direct current across the power supply terminals. Also illustrated in the publication are depletion mode devices receiving an input signal at their gating electrodes.

A known advantage of depletion mode field effect transistor devices is that the "threshold voltage" drop associated with enhancement mode field effect transistor devices is eliminated. The advantages of "switched" depletion mode devices over self-biased depletion mode devices include positive timing control and reduced rise delay. One solution to the "threshold voltage drop" problem in enhancement mode devices has been the use of a gate to source bootstrap capacitor as described, for example, in Polkinghorn U.S. Pat. No. 3,506,851. In that patent, however, only one of the series connected output transistors has its gate connected to an input signal and no depletion mode devices are described. As described in the foregoing specific references and numerous others, the prior art has strived to provide high speed output signals with a full supply voltage swing with minimal power dissipation.

SUMMARY OF THE INVENTION

Accordingly, it is an object of this invention to provide an improved FET driver circuit that maximizes performance while minimizing power dissipation.

It is another object of this invention to provide an improved driver circuit with a full supply voltage output swing.

In accordance with the present invention, a driver circuit with a push-pull output is provided. The push-pull output is implemented by first and second enhancement mode output field effect transistors (FET's) connected in series across a supply potential. An input is received at the gate electrode of one of these output FET's, while the output, taken from a point between the two output FET's is connected to the gate electrode of the other of the two output FET's through a circuit path including a series connected capacitor and depletion mode field effect transistor. This "bootstrapping" technique improves the transient response. An additional depletion mode field effect transistor in parallel with the bootstrapped output transistor maintains a full supply potential output in the steady-state.

In one embodiment, the depletion mode field effect transistor in series with the bootstrap capacitor between the output and the second input of the push-pull circuit has a gate electrode connected to one phase of the input signal while two additional transistors connected in a series path across the supply potential with said depletion mode device have their gate electrodes connected to an opposite phase of the input signal. The opposite phase of the input signal is provided by an inverter circuit including a series connected self-biased depletion mode field effect transistor and an enhancement mode field effect transistor. In this manner, a down level logic input signal provides a down level logic output signal while pre-charging certain of the internal circuit nodes as will be explained in greater detail herein. Upon the occurrence of an up going input signal, the output signal begins to rise, the depletion mode transistor in series with the bootstrapped capacitor is turned on causing a rapid and complete up level transient at the output node.

The foregoing and other objects, features and advantages of this invention will be apparent from the following more particular description of the preferred embodiments of the invention, as illustrated in the accompanying drawings.

DESCRIPTION OF THE PREFERRED EMBODIMENT

Figure 1:
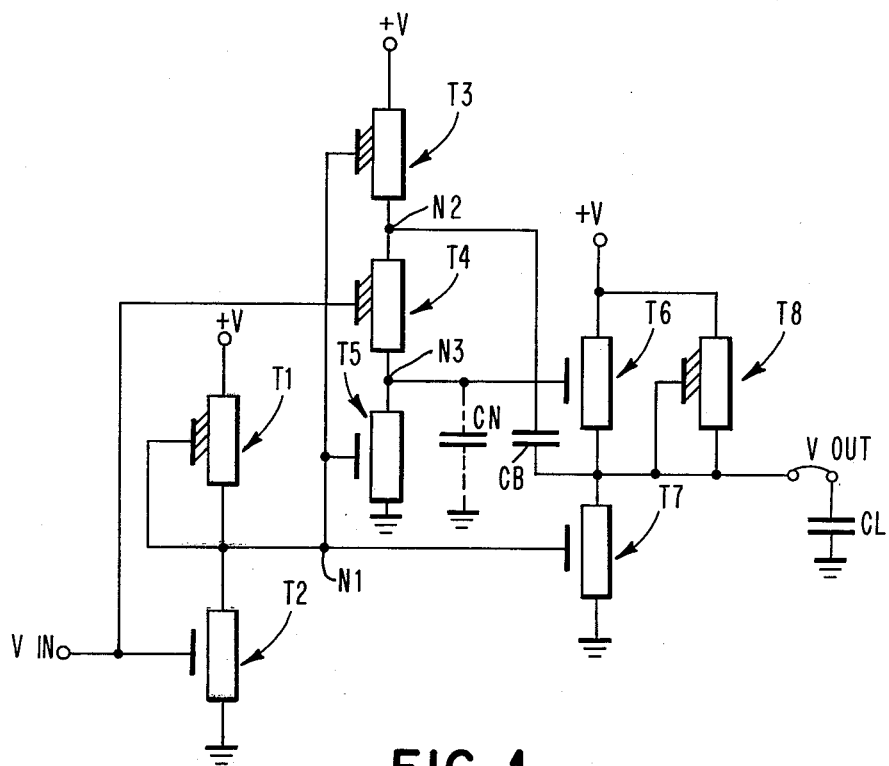
FIG. 1 is a circuit diagram of a preferred embodiment of this invention.

Refer now to FIG. 1 for a preferred embodiment of the present invention. The input node (V IN) is connected to an inverter circuit including depletion mode field effect transistor T1 and enhancement mode field effect transistor T2. T1 and T2 have their drain to source paths connected in electrical series, the drain electrode of T1 being connected to a first source of potential (+V) while the source electrode of T2 is connected to a second source of potential (ground). T1 is connected in a self-biased configuration consisting of a connection between its gate electrode and its source electrode. The drain of T2 is connected in common with the source of T1 providing an output to a common electrical point within the circuit designated node N1. The input node is connected to the gate of T2, as shown.

A second series electrical path between the first source of potential (+V) and the second source of potential (ground) is formed by depletion mode field effect transistor T3, depletion mode field effect transistor T4, and enhancement mode field effect transistor T5. The drain of T3 is connected to +V while the source of T3 is connected to the drain of T4. The source of T4 is connected to the drain of T5 while the source of T5 is connected to ground potential. The gate electrodes of T3 and T5 are connected to node N1 while, in accordance with the FIG. 1 embodiment of this invention, the gate of T4 is connected to the input node. The common electrical point between T3 and T4 is designated as node N2 while the common electrical point between T4 and T5 is designated as node N3.

With continued reference to FIG. 1, a push-pull output circuit is also connected between the first source of potential (+V) and the second source of potential (ground). The push-pull circuit includes a pair of series connected enhancement mode field effect transistors T6 and T7. The drain of T6 is connected to the +V terminal while the source of T7 is connected to ground potential. The source of T6 is connected to the drain of T7 and forms a common electrical point which becomes the output (V OUT) of the driver circuit. The first input to the push-pull output circuit is connected at the gate of T7. As illustrated, this is a connection from node N1 which carries an out of phase component of the signal received on the input terminal V IN.

The output of the push-pull output circuit is connected to a feedback capacitor CB also referred to, in the art, as a bootstrap capacitor. The other side of this capacitor is connected to node N2. The second input of the push-pull output circuit is connected at the gate of T6, the gate of T6 being connected to node N3. In this way, the gate electrode of T6 is connected to the output of the push-pull output circuit by means of a circuit path which includes a series connected capacitance CB and depletion mode field effect transistor T4. An additional depletion mode field effect transistor T8 is connected between the first source of potential (+V) and the output. In the FIG. 1 illustration, T8 is shown self-biased with its gate and source electrode connected in common to the output. Also illustrated as connected to the output is a load capacitance CL. This serves to illustrate that the present driver circuit has the capability to drive highly capacitive loads. In practice, capacitance CL represents the equivalent circuit of the input capacitance of subsequent stages that are driven by the presently described driver circuit. A further capacitance CN is illustrated connected between N3 and ground. This is also an equivalent circuit representation of a parasitic capacitance that is known to be present at this point in the circuit. Accordingly, capacitance CN is an undesired capacitance and is illustrated solely to point out that the bootstrap capacitor CB must be much larger than the undesired parasitic capacitance CN in order to fulfill its desired bootstrapping function.

Figure 3:
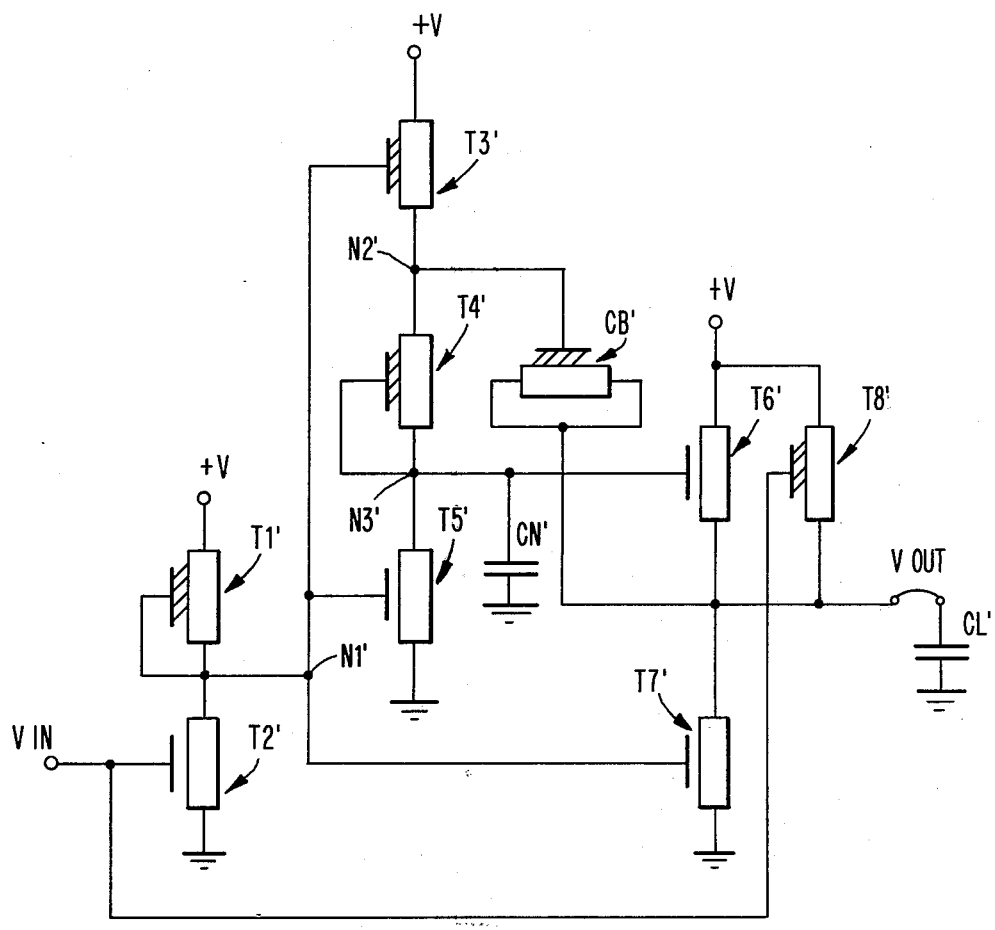
FIG. 3 is a circuit diagram of an alternate embodiment of this invention.

Refer now to FIG. 3 which is a circuit diagram intended to illustrate variations in the FIG. 1 embodiment. The circuits are conceptually similar and corresponding elements have been designated with reference numerals having prime notation. The inverter circuit is again illustrated by series connected transistors T1' and T2' connected in a manner identical to T1 and T2 in FIG. 1. Transistors T3', T4', and T5' have their drain to source paths connected in series between +V and ground as is the case for the corresponding transistors in FIG. 1. Further, transistors T6' and T7' have their drain to source paths connected in series between +V and ground while T8' has its drain to source path connected between +V and the output, all in accordance with the corresponding transistors in FIG. 1.

As illustrated in FIG. 3, the bootstrap capacitor CB' is shown as a depletion mode field effect transistor having its drain and source electrodes connected in common and to the output node. The gate of depletion mode field effect transistor CB' is connected to node N2'. This is the preferred manner of fabricating a capacitor in integrated form. A variation between the circuits of FIG. 3 and FIG. 1 is the self-biasing gate to source connection of transistor T4' at node N3'. Such a connection saves a gating line between the input and the gate of T4' but might require the adjustment of the width to length ratios of T3', T4', and T5'. The FIG. 1 circuit may be varied further by the connection of the gate of T8' to the input node as illustrated in FIG. 3. If T8' is connected in such a gateable configuration, the transient response of the output charging is slightly improved.

Those skilled in the art are aware of the various considerations in determining the width to length ratio that is to be attributed to a particular field effect transistor. There are trade-offs involved in determining whether a transistor such as T4 and T8 ought to be self-biased or gated. In the selfbiased configuration, the rise delay is longer, but the rise time slope is steeper. Conversely, an FET receiving a gating pulse will experience a shorter rise delay, but will have a longer rise time. Generally, a device having a small width to length ratio occupies a minimum area on the semiconductor surface, and is characterized by low input capacitance and low current carrying capability. Conversely, a device with a high width to length ratio can carry large currents, has a higher input capacitance and occupies a greater area on the surface of the semiconductor.

By way of example, and without intending to limit in any way, typical ranges of width to length ratios are briefly described. Transistor T8 is typically a minimum area device having a width to length ratio of 1/1. While T8 is the smallest device, transistors T6 and T7, forming the push-pull amplifier, are by far the largest devices. This is necessary to fulfill the current driving capability of the present circuit. Thus, transistor T6 (or T6') might have a width to length rato of 200/1 depending on the value of the load capacitance. A load capacitance of 50pF might be driven by this size T6 device. In the case of a relatively low load capacitance such as 10pF, a width to length ratio of 50/1 might suffice. Similarly, transistor T7 (or T7') has a width to length ratio of 200/1. This last mentioned width to length ratio also depends on the size of the load capacitance and further depends on the down level current requirements of the subsequent circuit stage. The other devices illustrated in the circuit of FIGS. 1 and 3 are intermediate in size having typical width to length ratios in the range up to 20/1. Accordingly, T1 (or T1') might have a 5/1 ratio while T2 (or T2') would be approximately three times as large. In a similar relationship, T3 might be selected with a width to length ratio 10/1, T4 3/1, and T5 10/1. When T4' is self-biased, its width to length ratio might be increased to, for example, 4.5/1 while T3' would be 12/1 and T5' would be 13/1. A typical capacitance value for CB (or CB') would be approximately 3pF.

It is again pointed out that those skilled in the art are fully aware of the various process variations and specialized requirements which cause the tailoring of width to length ratios of various devices for each specific process and application. The foregoing are therefore given to point out that in integrated circuit technology, the amount of space occupied by a particular circuit is significantly effected bythe size of the individual devices, possibly more so than the actual device count. Also pointed out is the fact by the in the herein circuit, the input capacitance to a device such as T2 (or T2') is relatively low placing no special requirements on the output of the preceding circuit stage. This, of course, would not be the case if the input node were connected directly to a relatively large device such as T7 (or T7').

In operation, the present circuit provides a full signal output to a highly capacitive load with high current requirements. By full signal swing is meant an up level logic voltage that is the equivalent of the supply potential $+V$ and a down level that is equivalent to ground potential. The prior art has previously addressed the up level problem caused by the threshold voltage drop of transistor T6 (or T6'). Power consumption and dissipation is minimized by maintaining one of transistors T6 or T7 off at all times preventing a DC current path through the large devices.

Figure 2:
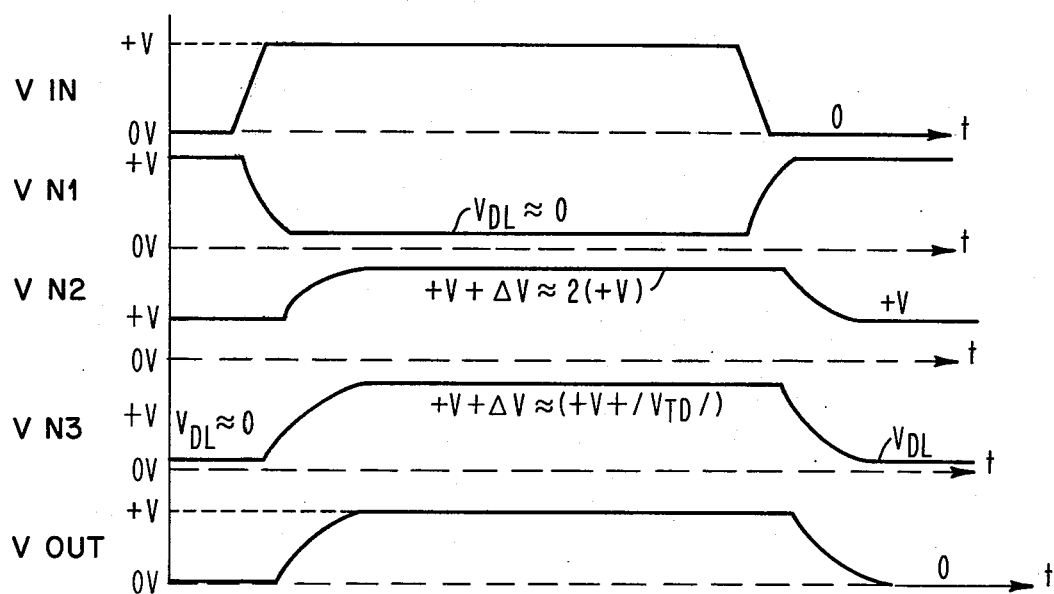
FIG. 2 is a waveform diagram illustrating the operation of the circuit of FIG. 1.

With continued reference to FIG. 1, and also referring to FIG. 2, the operation of the FIG. 1 circuit will be described. In the present configuration, down logic levels will refer to ground potential while up logic levels will refer to $+V$. When the input potential V IN is at a down level, T2 is off permitting T1 to charge node N1 to an up level. This up level at node N1 keeps T7 on keeping the output potential V OUT at a down level. Node N1 being at an up level also turns T5 on keeping node N3 sufficiently low (below the threshold level of T6) to keep T6 off. At this point in time, there is a small drain current through T8 but this is insufficient to effect the down level at the output node. The fact that node N1 is at an up level causes T3 to be on very hard charging node N2 (and capacitance CB) to an up level. It is a known characteristic of depletion mode devices that they are not turned off by zero gate to source bias. Thus, even though the gate of T4 is held at a down level, a small drain current passes through T4 slightly charging node N3 to a potential level identified as $V_{DL}$. This down level potential is approximately equal to zero serving the same purpose as a zero volt potential would to the gate of T6, maintaining it off.

As soon as the input voltage (V IN) is brought to an up level, transistor T2 is turned on and transistor T4 is turned on hard. Node N1 is discharged to a down level approximately equal to a ground potential. This down level potential at node N1 turns off T7 and brings the gate of T3 to nearly ground potential turning T3 off for typical depletion device threshold voltages. With T4 on, node N3 rises above the threshold voltage of T6 turning T6 on while T7 was turned off by the down level at node N1. As the output node rises, this increase in voltage is fed through capacitance CB to node N2 causing it to rise above $+V$ maintaining transistor T3 completely off. It is noted that the gate of T3 was previously brought to a down level by the down level at node N1. As node N2 rises, and since T4 is conducting, node N3 similarly increasing the potential at the gate of T6. In the ultimate, as the output node rises from a down logic level to an up logic level, node N2 rises from an up logic level to twice the up logic level. This potential at node N2 is passed through transistor T4 to the gate of T6, permitting T6 to pass the full logic up level. In practice, node N3 will rise to a potential $+V$ plus the magnitude (absolute value) of the depletion mode device T4 threshold voltage.

It is required that capacitance CB be considerably larger than the total parasitic nodal capacitance CN on nodes N2 and N3 in order for the bootstrap action to be effective. Typically, CB has a capacitance value two to five times as large as CN. If the up level lasts a long time, nodes N2 and N3 will start to discharge toward a lower potential due to parasitic leakage from nodes N2 and N3 to the substrate. In order to maintain V OUT at a full logic up level, T8 being turned on holds the output at $+V$. Even though T8 is designed to be very small, it has sufficient current capability to compensate for leakage from the output node.

As the input node is brought to a down level again, T2 is turned off and T1 changes node N1 to $+V$. T5 then turns on discharging node N3 to a down level. The down level input at the gate of T4 causes it to assume its low conduction state limiting the current in the T3/T4/T5 leg. Transistor T3 again turns on hard recharging capacitance CB to $+V$ to prepare for the next cycle. At the same time, transistor T7 is turned on by the up level at node N1 discharging the output node to zero. Since node N3 is discharged to nearly zero, transistor T6 turns off limiting the DC current in the push-pull output to minimal conduction through transistor T8 and T7.

As previously explained, low DC power is obtained since T6 and T7 are not simultaneously on and do not conduct on a direct current basis. It is pointed out that some direct current is dissipated by T1 and T2 when T2 is on. Similarly, some DC power is dissipated by T3/T4/T5 when node N1 is at an up level and all three of the transistors in this series circuit path conduct. Such power dissipation, however, is considered minimal because it is through the small devices. Thus, a low input capacitance and a high output drive capability is maintained with relatively minimal power dissipation.

The circuit of FIG. 3 operates in a manner similar to the circuit of FIG. 1. By having a transistor T4' self-biased, the transient response of transferring an up going voltage from node N2' to N3' is slightly affected. Specifically, a longer turn on delay may be experienced. This is a disadvantage that may be acceptable in some applications.

What has then been described is an improved enhancement/depletion bootstrap FET driver circuit in which the various tradeoffs have been optimized to drive a highly capacitive load. While the invention has been particularly shown and described with reference to preferred embodiments, it will be understood by those skilled in the art that various changes in form and detail may be made therein without departing from the spirit and scope of the invention.

What is claimed is:
1. An improved driver circuit comprising:
a first source of potential;
a second source of potential;
a push-pull output circuit, having first and second inputs and an output, connected between said first and second sources of potential;
said first input of said push-pull output circuit adapted to receive an input signal; and
a circuit path, including a series connected capacitance and first field effect transistor, connecting said second input and said output, said first field effect transistor having a gating electrode for receiving one phase of said input signal while said first input of said push-pull output circuit adapted to receive an input signal receives another phase of said input signal.

2. An improved driver circuit as in claim 1 wherein said first field effect transistor is a depletion node field effect transistor.

3. An improved driver circuit as in claim 2 wherein said capacitance is formed by a second depletion mode field effect transistor having its source and drain regions connected in common and to said output, and having its gate connected to said first depletion mode field effect transistor.

4. An improved driver circuit as in claim 1 wherein said push-pull output circuit comprises:
- a second field effect transistor having drain, source, and gate, electrodes;
- a third field effect transistor having drain, source, and gate electrodes;
- said second and third field effect transistors having their drain to source paths connected in series between said first and second sources of potential, said output being at a common electrical point between said second and third transistors;
- said first input of said push-pull output circuit being connected to the gate electrode of said second field effect transistor;
- said second input of said push-pull output circuit being connected to the gate electrode of said third field effect transistor, by means of said circuit path.

5. An improved driver circuit as in claim 4 wherein said first field effect transistor is a depletion mode field effect transistor.

6. An improved driver circuit as in claim 5 further comprising:
- an inverter circuit connected between an input node and said first input of said push-pull output circuit adapted to receive an input signal.

7. An improved driver circuit as in claim 6 further comprising:
- a fourth field effect transistor being depletion mode connected between said first source of potential and said output.

8. An improved driver circuit as in claim 7 wherein said fourth field effect transistor has its gating electrode connected to said input node.

9. An improved driver circuit as in claim 5 wherein said capacitance is formed by a fourth field effect transistor being depletion mode and having its source and drain regions connected in common and to said output and having its gate connected to said first depletion mode field effect transistor.

10. An improved driver circuit comprising:
- a first source of potential;
- a second source of potential;
- a push-pull output circuit, having first and second inputs and an output, connected between said first and second sources of potential;
- said first input of said push-pull output circuit adapted to receive an input signal;
- a circuit path, including a series connected capacitance and a first field effect transistor having a gating electrode and first and second gated electrodes, connecting said second input and said output;
- a second field effect transistor having gate, drain, and source electrodes, its drain to source path connected between said first source of potential and the first gated electrode of said first field effect transistor;
- a third field effect transistor having gate, drain and source electrodes, its drain to source path connected between said second source of potential and the second gated electrode of said first field effect transistor;
- the gate electrode of each said second and third field effect transistors being adapted to receive said input signal.

11. An improved driver circuit as in claim 10 further comprising:
- an inverter circuit connected between an input node and said first input of said push-pull output circuit adapted to receive an input signal.

12. An improved driver circuit as in claim 11 further comprising:
- a fourth field effect transistor connected between said first source of potential and said output, said fourth field effect transistor being depletion mode.

13. An improved driver circuit as in claim 12 wherein said fourth field effect transistor has its gating electrode connected to said input node.

* * * * *